(12) United States Patent
Latypov et al.

(10) Patent No.: US 9,170,501 B2
(45) Date of Patent: Oct. 27, 2015

(54) METHODS FOR FABRICATING INTEGRATED CIRCUITS INCLUDING GENERATING PHOTOMASKS FOR DIRECTED SELF-ASSEMBLY

(71) Applicant: GLOBALFOUNDRIES, Inc., Grand Cayman, KY (US)

(72) Inventors: Azat Latypov, San Jose, CA (US); Yi Zou, Foster City, CA (US); Vito Dai, Santa Clara, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 43 days.

(21) Appl. No.: 13/936,924

(22) Filed: Jul. 8, 2013

(65) Prior Publication Data

US 2015/0012897 A1 Jan. 8, 2015

(51) Int. Cl.
*G06F 17/50* (2006.01)
*G03F 7/20* (2006.01)

(52) U.S. Cl.
CPC .................................. *G03F 7/70441* (2013.01)

(58) Field of Classification Search
CPC .............. G03F 1/36; G03F 1/38; G06F 17/50
USPC .................................................... 716/100, 55
See application file for complete search history.

(56) References Cited

U.S. PATENT DOCUMENTS

| | | | |
|---|---|---|---|
| 6,745,380 B2 | 6/2004 | Bodendorf et al. | |
| 7,237,221 B2 | 6/2007 | Granik et al. | |
| 7,521,094 B1 | 4/2009 | Cheng et al. | |
| 7,861,207 B2 | 12/2010 | Word et al. | |
| 7,903,856 B2 | 3/2011 | Pfister et al. | |
| 8,045,785 B2 | 10/2011 | Kitamura et al. | |
| 8,155,649 B2 | 4/2012 | McHenry et al. | |
| 8,326,313 B2 | 12/2012 | McHenry et al. | |
| 8,336,003 B2 * | 12/2012 | Cheng et al. | 716/53 |
| 8,656,322 B1 * | 2/2014 | Dechene et al. | 716/55 |
| 8,667,428 B1 * | 3/2014 | Latypov | 716/51 |
| 8,667,430 B1 * | 3/2014 | Latypov | 716/51 |

(Continued)

FOREIGN PATENT DOCUMENTS

JP 200915491 A 1/2009
TW 201124871 A1 7/2011

OTHER PUBLICATIONS

USPTO, Office Action for U.S. Appl. No. 13/659,453, mailed Jul. 9, 2013.

(Continued)

*Primary Examiner* — Suchin Parihar
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes using a computing system, inputting a DSA target pattern and an initial pattern. An output mask writer pattern is produced from the initial pattern using the computing system, the DSA target pattern, a DSA model, an OPC model, and a MPC model. The output mask writer pattern is for a mask writer to write on the photomask.

19 Claims, 3 Drawing Sheets

(56) References Cited

U.S. PATENT DOCUMENTS

| | | | |
|---|---|---|---|
| 2008/0212857 | A1 | 9/2008 | Pfister et al. |
| 2009/0132984 | A1 | 5/2009 | Chander et al. |
| 2010/0075704 | A1 | 3/2010 | McHenry et al. |
| 2010/0097952 | A1 | 4/2010 | McHenry et al. |
| 2010/0105332 | A1 | 4/2010 | McHenry et al. |
| 2010/0173586 | A1 | 7/2010 | McHenry et al. |
| 2011/0209106 | A1* | 8/2011 | Cheng et al. ............ 716/55 |
| 2012/0005634 | A1 | 1/2012 | Seltmann et al. |
| 2012/0141924 | A1 | 6/2012 | Sahouria |
| 2012/0329289 | A1 | 12/2012 | Fujimura et al. |
| 2012/0331428 | A1* | 12/2012 | Cheng et al. ............ 716/52 |
| 2013/0224635 | A1 | 8/2013 | Takekawa et al. |
| 2013/0283216 | A1* | 10/2013 | Pearman et al. ............ 716/52 |
| 2013/0283218 | A1* | 10/2013 | Fujimura et al. ............ 716/53 |
| 2014/0127628 | A1* | 5/2014 | Fujimura et al. ............ 430/296 |
| 2014/0229904 | A1* | 8/2014 | Fujimura et al. ............ 716/54 |

OTHER PUBLICATIONS

USPTO, Response to Office Action for U.S. Appl. No. 13/659,453, mailed Sep. 30, 2013.
USPTO, Notice of Allowance and Fee(s) Due for U.S. Appl. No. 13/659,453, mailed Oct. 15, 2013.
U.S. Appl. No. 13/936,910 filed Jul. 8, 2013.
Ji Xu, Introduction to Directed Self-Assembly (DSA) of Block Copolymer (BCP) in Thin Films, Jun. 29, 2011.
Azat Latypov, What is Directed Self-Assembly, Oct. 20, 2011.
9. Daniel J.C. Herr, Directed block copolymer self-assembly for nanoelectronics fabrication, J. Mater. Res., vol. 26, No. 2, Jan. 28, 2011.
23. Michael B. Giles and Niles A. Pierce, "An Introduction to the Adjoint Approach to Design", Flow, Turbulence and Combustion, 65(3-4):393-415, 2000.
H.-S. Philip Wong et al, "Block copolymer directed self-assembly enables sub-lithographic patterning for device fabrication", an oral presentation at the SPIE Advanced Lithography 2012 Symposium, to be published in the SPIE Advanced Lithography 2012 conference proceedings.
H.-S. Philip Wong, "Directed Self-Assembly for the Semiconductor Industry", an oral presentation at Globalfoundries, Inc. Feb. 3, 2012.
Chi-Chun Liu et al, "Progress towards the integration of optical proximity correction and directed self-assembly of block copolymers with graphoepitaxy", an oral presentation at the SPIE Advanced Lithography 2012 Symposium, to be published in the SPIE Advanced Lithography 2012 conference proceedings.
Wikipedia contributors, "Copolymer", Wikipedia, The Free Encyclopedia, <http://en.wikipedia.org/w/index.php?title=Copolymer&oldid=457198836>. Oct. 24, 2011.
M. W. Matsen, Self-consistent field theory and its applications. In Soft Matter, vol. 1: Polymer Melts and Mixtures, Edited by G. Gompper and M. Schick (Wiley-VCH, Weinheim, 2006). ISBN: 3-527-30500-9, <http://www.personal.rdg.ac.ukl~sps96mwm/matsen_scft.pdf>.
Wikipedia contributors, "Penalty method", Wikipedia, The Free Encyclopedia, <http://en.wikipedia.org/w/index.php?&oldid=465609685>. Dec. 13, 2011.
Wikipedia contributors, "Gradient descent", Wikipedia, The Free Encyclopedia, <http://en.wikipedia.org/w/index.php?&oldid=486689439>. Apr. 10, 2012.
Wikipedia contributors, "Newton's method in optimization", Wikipedia, The Free Encyclopedia, <http://en.wikipedia.org/w/index.php?&oldid=480670839>. Mar. 7, 2012.
Wikipedia contributors, "Non-linear least squares", Wikipedia, The Free Encyclopedia, <http://en.wikipedia.org/w/index.php?&oldid=481409505>. Mar. 11, 2012.
Wikipedia contributors, "Gauss-Newton algorithm", Wikipedia, The Free Encyclopedia, <http://en.wikipedia.org/w/index.php?&oldid=478249186>. Feb. 22, 2012.
Wikipedia contributors, "Levenberg—Marquardt algorithm", Wikipedia, The Free Encyclopedia, <http://en.wikipedia.org/w/index.php?&oldid=486636602>. Apr. 10, 2012.
Wikipedia contributors, "Quasi—Newton method", Wikipedia, The Free Encyclopedia, <http://en.wikipedia.org/w/index.php?&oldid=483333808>. Mar. 22, 2012.
Wikipedia contributors, "Conjugate gradient method", Wikipedia, The Free Encyclopedia, <http://en.wikipedia.org/w/index.php?&oldid=487492827>. Apr. 15, 2012.
Austen G.Duffy "An Introduction to Gradient Computation by the Discrete Adjoint Method", Technical report, Florida State University (2009), <http://computationalmathematics.org/topics/files/adjoint-techreport.pdf>.
U.S. Appl. No. 14/072,164, filed Nov. 5, 2013.
USPTO, Non-Final Office Action for U.S. Appl. No. 13/936,910, mailed Jul. 3, 2014.
Taiwan Intellectual Property Office, Examination Report for Taiwanese Patent Application No. 102107449, mailed Jun. 19, 2014.

* cited by examiner

METHODS FOR FABRICATING INTEGRATED CIRCUITS INCLUDING GENERATING PHOTOMASKS FOR DIRECTED SELF-ASSEMBLY

TECHNICAL FIELD

The technical field relates generally to methods for fabricating integrated circuits, and more particularly relates to methods for fabricating integrated circuits including generating photomasks for directed self-assembly.

BACKGROUND

Decreasing device size and increasing device density has traditionally been a high priority for the manufacturing of the integrated circuits. Optical lithography has been a driving force for device scaling. Conventional optical lithography is limited to about 80 nm pitch for single exposure patterning. While double and other multi-patterning processes can realize smaller pitch, these approaches are expensive and more complex.

Directed self-assembly (DSA), a technique that aligns self-assembling polymeric materials on a lithographically defined directing or guide pattern, is a potential option for extending current lithography beyond its pitch and resolution limits. The self-assembling materials, for example, are block copolymers (BCPs) that consist of an "A" homopolymer covalently attached to a "B" homopolymer, which are deposited over a lithographically defined directing pattern on a semiconductor substrate. The lithographically defined directing pattern is a pre-pattern (hereinafter "DSA directing pattern") that is encoded with spatial chemical and/or topographical information (e.g., chemical epitaxy and/or graphoepitaxy) and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying DSA directing pattern to define a nanopattern (hereinafter "DSA pattern"). Then, by removing either the A polymer block or the B polymer block by wet chemical or plasma-etch techniques, a mask is formed for transferring the DSA pattern to the underlying semiconductor substrate.

Generating a photomask for lithographically defining the DSA directing pattern to accurately form the shape of the DSA pattern requires proper accounting of a multitude of physical effects that occur during the DSA process including from photomask writing on through to etching of the phase-separated self-assembly materials to form the DSA pattern. For instance, a typical DSA process involves fabrication of a patterned photomask to be used to make the DSA directing pattern, exposing this photomask in a lithographic tool to photoresist that is disposed on a semiconductor substrate, developing the exposed photoresist, performing other processing steps needed to create the DSA directing pattern, spin coating the pre-patterned semiconductor substrate with BCP, and annealing and etching the BCP to form the DSA pattern. Unfortunately, current approaches for generating a photomask for lithographically defining a DSA directing pattern to form a DSA pattern do not fully account for the physical effects that occur during the DSA process.

Accordingly, it is desirable to provide methods for fabricating integrated circuits including generating a photomask for lithographically defining a DSA directing pattern to accurately form a DSA pattern. Moreover, it is desirable to provide methods for fabricating integrated circuits including generating a photomask for lithographically defining a DSA directing pattern that more fully accounts for the physical effects that occur during a DSA process. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern and an initial pattern. An output mask writer pattern is produced from the initial pattern using the computing system, the DSA target pattern, a DSA model, an OPC model, and a MPC model. The output mask writer pattern is for a mask writer to write on the photomask.

In accordance with another exemplary embodiment, a method for fabricating an integrated circuit is provided. The method includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern and an initial mask pattern. Using the computing system, applying a MPC model to the initial mask pattern to produce a first output mask pattern. Using the computing system, applying an OPC model to the first output mask pattern to produce a first output DSA directing pattern. Using the computing system, applying a DSA model to the first output DSA directing pattern to produce a first output DSA pattern. Using the computing system, computing a DSA PC residual between the DSA target pattern and the first output DSA pattern. Using the computing system, comparing the DSA PC residual to a predetermined DSA PC tolerance. If the DSA PC residual is greater than the predetermined DSA PC tolerance, then the initial mask pattern is adjusted to generate a first updated mask pattern.

In accordance with another exemplary embodiment, a method for fabricating an integrated circuit is provided. The method includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern and an initial OPCed pattern. Using the computing system, applying an OPC model to the initial OPCed pattern to produce a first output DSA directing pattern. Using the computing system, applying a DSA model to the first output DSA directing pattern to produce a first output DSA pattern. Using the computing system, computing a DSA PC residual between the DSA target pattern and the first output DSA pattern. Using the computing system, comparing the DSA PC residual to a predetermined DSA PC tolerance. If the DSA PC residual is greater than the predetermined DSA PC tolerance, then the initial OPCed pattern is adjusted to generate a first updated OPCed pattern.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
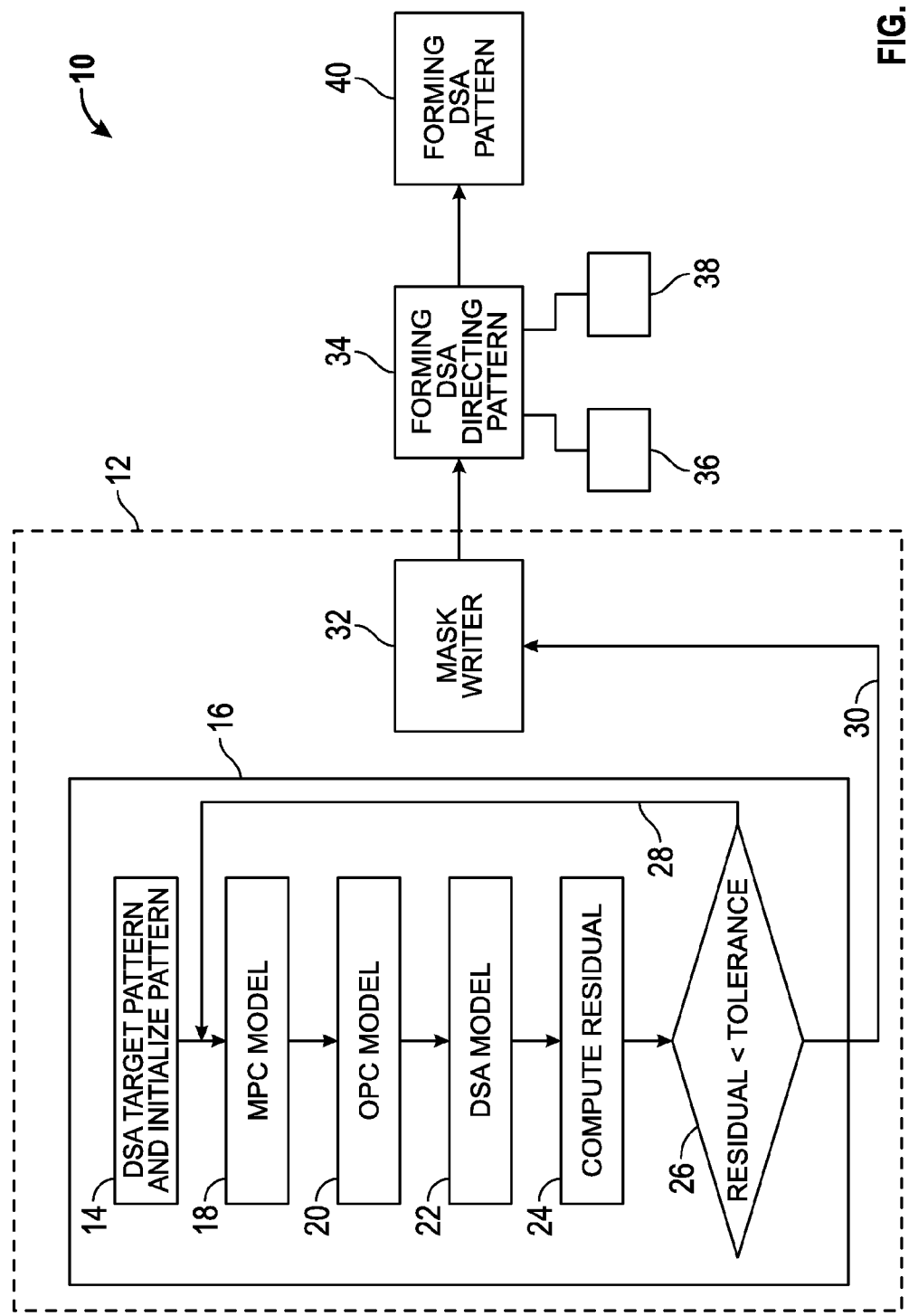
FIG. 1 is a schematic illustration of a block diagram of a method for fabricating an integrated circuit in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein generate a photomask for forming a DSA directing pattern on a semiconductor substrate. The DSA directing pattern is for guiding a self-assembly material (e.g., BCP) that is deposited on the DSA directing pattern and that undergoes directed self-assembly (DSA), e.g., phase separation during annealing, to form a DSA pattern. The photomask is generated by inputting a DSA target pattern and an initial pattern into a computing system. The DSA target pattern is a desired or predetermined DSA pattern that is to be fabricated on the semiconductor substrate using the DSA process. In an exemplary embodiment, the initial pattern is an initial mask pattern that represents an initial guess or approximation of a photomask pattern for lithographically defining the DSA directing pattern to form the DSA target pattern.

An output mask writer pattern is produced from the initial pattern using the computing system, the DSA target pattern, a DSA (or DSA PC—directed self-assembly process/proximity correction) model, an OPC (optical proximity correction) model, and a MPC (mask process/proximity correction) model. The output mask writer pattern is for a mask writer to write on the photomask. In an exemplary embodiment, the output mask writer pattern is produced by applying the MPC model to the initial mask pattern to produce an output mask pattern. The MPC model computes the pattern written on the photomask given the pattern (or shots) communicated to the mask writer taking into account various mask writing effects (e.g., long range and short range proximity effects).

In an exemplary embodiment, the OPC model is applied to the output mask pattern to produce an output DSA directing pattern. The OPC model computes the patterns written on the wafer given the patterns written on the photomask taking into account the physical effects that occur during the exposure of the photoresist coated semiconductor substrate in the lithography tool and also in the development and etching of the exposed photoresist coated semiconductor substrate.

In an exemplary embodiment, the DSA model is applied to the output DSA directing pattern to produce an output DSA pattern. The DSA model computes the DSA fabricated pattern given the DSA directing pattern taking into account the physical effects that occur during the DSA process including annealing and etching of the self-assembly material.

A DSA PC residual is then computed between the DSA target pattern and the output DSA pattern. The DSA PC residual is compared to a predetermined DSA PC tolerance. The application of the MPC, OPC, and DSA models, computing of the DSA PC residual, and comparing the DSA PC residual to the predetermined DSA PC tolerance are cooperatively configured as an iterative loop. If the DSA PC residual is greater than the predetermined DSA PC tolerance, then the initial mask pattern is adjusted to generate an updated mask pattern that is fed back to the iterative loop for one or more additional iterations. When the current iteration DSA PC residual is less than the predetermined DSA PC tolerance, then the corresponding current iteration, updated mask pattern is outputted from the iterative loop as the output mask writer pattern.

In an exemplary embodiment, the output mask writer pattern is communicated to a mask writer for writing on the photomask to produce a patterned photomask. Because a multitude of physical effects that occur during the DSA process including from photomask writing on through to etching of the phase separated self-assembly material have been accounted for in producing the output mask writer pattern, the patterned photomask can be used to lithographically define a DSA directing pattern that accurately forms the shape of the DSA pattern, e.g., target the DSA pattern.

FIG. 1 is a schematic illustration of a block diagram of a method 10 for fabricating an integrated circuit (IC) in accordance with an exemplary embodiment. The described process steps, procedures, and materials are to be considered only as exemplary embodiments designed to illustrate to one of ordinary skill in the art the methods contemplated herein; the methods are not limited to these exemplary embodiments. Various steps in the manufacture of ICs are well known and so, in the interest of brevity, many conventional steps will only be mentioned briefly herein or will be omitted entirely without providing the well-known process details.

The method 10 includes generating a photomask (step 12) for forming a DSA directing pattern (e.g., a chemical epitaxy pre-pattern or a graphoepitaxy pre-pattern, e.g., confinement wells) on a semiconductor substrate. The photomask may be, for example, an optical lithography photomask or an extreme ultraviolet (EUV) lithography photomask. The DSA directing pattern is for guiding a DSA material deposited on the DSA directing pattern during a DSA process in which the DSA material undergoes DSA (e.g., nano-size/scale phase separation that is registered to the DSA directing pattern) to form a DSA pattern.

As illustrated, a DSA target pattern and an initial mask pattern (initial pattern of the photomask and may also be referred to as an initial MPCed pattern) are input into a computing system (step 14). The term "DSA target pattern" is used herein to denote the patterns that are desired or predetermined to be fabricated on the semiconductor substrate using the DSA process. For instance, these patterns may include lines and spaces, isolated lines, contact holes, and other features, e.g., typically polygon type features, needed for IC fabrication. The DSA target pattern can be specified as a set of polygons or a set of smooth curves. The term "initial mask pattern" is used herein to denote an initial guess or approximation of a photomask pattern for lithographically defining the DSA directing pattern for forming the DSA target pattern. The DSA target pattern and the initial mask pattern are used in a coupled global flow 16 that includes a MPC model, an OPC model, and a DSA model to account for a multitude of physical effects that occur during the DSA process.

In an exemplary embodiment, using the computing system, the MPC model is applied (step 18) to the initial mask pattern to produce an output mask pattern. As discussed above, the MPC model computes the pattern written on the photomask given the pattern (or shots) communicated to the mask writer taking into account various mask writing effects (e.g., long range and short range proximity effects).

In an exemplary embodiment, using the computing system, the OPC model is applied (step 20) to the output mask pattern to produce an output DSA directing pattern. As discussed above, the OPC model computes the patterns written on the photomask given the patterns (or shots) communicated to a mask writer taking into account the physical effects that occur during the exposure of the photoresist coated semiconductor substrate in the lithography tool and also in the development and etching of the exposed photoresist coated semiconductor substrate.

In an exemplary embodiment, using the computing system, the DSA model is applied (step 22) to the output DSA directing pattern to produce an output DSA pattern. As discussed above, the DSA model computes the DSA fabricated pattern given the DSA directing pattern taking into account the physical effects that occur during the DSA process including annealing and etching of the self-assembly material.

In an exemplary embodiment, a DSA PC residual is computed (step 24) between the DSA target pattern and the output DSA pattern. The DSA PC residual is compared to a predetermined DSA PC tolerance (step 26). As discussed above, the application of the MPC, OPC, and DSA models, computing of the DSA PC residual, and comparing the DSA PC residual to the predetermined DSA PC tolerance are cooperatively configured as an iterative loop 28. If the DSA PC residual is greater than the predetermined DSA PC tolerance, then the initial mask pattern is adjusted to generate an updated mask pattern that is fed back to the iterative loop 28 for one or more additional iterations. When the current iteration DSA PC residual is less than the predetermined DSA PC tolerance, then the corresponding current iteration, updated mask pattern is outputted from the iterative loop 28 (step 30) as the output mask writer pattern.

One example of a generic coupled global flow 16 that includes a MPC model, an OPC model, and a DSA model is included in the following MATLAB-like pseudocode:

```
function MPCed_patterns = COUPLED_GLOBAL_FLOW(DSA_target_patterns, ...
                                               DSA_model, OPC_model, MPC_model, ...
                                               COUPLED_GLOBAL_FLOW_parameters)
    MPCed_patterns_current(1) = initialize_MPCed_patterns(DSA_model, DSA_target_patterns, ...
                                                          OPC_model, MPC_model);
    for iteration =1:COUPLED_GLOBAL_FLOW_parameters.n_iterations
        mask_patterns = apply_MPC_model (MPCed_patterns_current(iteration), ...
                                         MPC_model);
        wafer_patterns = apply_OPC_model (mask_patterns, ...
                                          OPC_model);
        DSA_patterns = apply_DSA_model (wafer_patterns, ...
                                        DSA_model);
        residual = compute_DSAPC_residual (DSA_patterns, ...
                                           DSA_target_patterns);
        if(DSAPC_norm(residual) < DSAPC_parameters.tolerance)
            MPCed_patterns = MPCed_patterns_current(iteration);
            return
        else
            MPCed_patterns_current(iteration+1) = COUPLED_GLOBAL_FLOW_update( ...
                                                  MPCed_patterns_current(iteration), ...
                                                  DSA_target_patterns, ...
                                                  residual, ...
                                                  MPC_model, OPC_model, DSA_model, ...
                                                  COUPLED_GLOBAL_FLOW_parameters);
        end
    end
    disp('Coupled global flow iterations did not coverage');
end
```

In this example, the COUPLED_GLOBAL_FLOW( ) function takes as inputs the DSA target patterns, the DSA model, the OPC model, the MPC model, and the parameters of the COUPLED_GLOBAL_FLOW and outputs the MPCed patterns (i.e., mask writer patterns). In the COUPLED_GLOBAL_FLOW( ) function, the MPCed patterns are generated iteratively. These patterns are initialized by inputting the initial MPCed patterns and the iterations are run within an iterative loop. On each pass of the iterative loop (for each iteration), the MPC model is applied to the current MPCed patterns to produce the current output mask patterns; the OPC model is applied to the current output mask patterns to produce the current output wafer patterns, i.e., current output DSA directing patterns; and the DSA model is applied to the current output wafer patterns to produce the current output DSA patterns to compute the residual (the discrepancy between the current output DSA pattern and the DSA target patterns). Depending on the value of a certain cost function, and dependent on the residual, the current iteration mask patterns, i.e., current iteration MPCed patterns, are either output as the output of the COUPLED_GLOBAL_FLOW( ) function, if the norm of the residual is sufficiently small, or are updated for the next iteration to further reduce the cost function value corresponding to the residual.

The method 10 continues by communicating the output mask writer pattern, e.g., current iteration, updated mask pattern or current iteration, output MPCed pattern, to a mask writer and writing on the photomask (step 32) to produce a patterned photomask. Because a multitude of physical effects of the DSA process have been accounted for in defining the output mask writer pattern, the patterned photomask can be used to lithographically define a DSA directing pattern that accurately forms the shape of the DSA pattern.

The method 10 continues by forming the DSA directing pattern overlying a semiconductor substrate (step 34). Forming the DSA directing pattern (step 34) includes patterning a photoresist layer that overlies the semiconductor substrate using the photomask. In an exemplary embodiment, the photoresist layer can be patterned with the photomask using well known optical or EUV lithographic techniques. In one embodiment, the photoresist layer is patterned for forming the DSA directing pattern having a graphoepitaxy surface (step 36) as is known in the art. In an exemplary embodiment, the graphoepitaxy surface includes confinement wells that define pre-pattern openings. In an alternative embodiment, the patterned photoresist layer is used for forming the DSA directing pattern having a chemical epitaxy surface (step 38) as is known in the art.

The method 10 continues by forming the DSA pattern (step 40). In an exemplary embodiment in which the DSA directing pattern has the graphoepitaxy surface, the DSA pattern is formed (step 40) by depositing a self-assembly material (BCP) on the graphoepitaxy surface including into the pre-pattern opening. In an alternative embodiment in which the DSA directing pattern has the chemical epitaxy surface, the self-assembly material is deposited overlying the chemical epitaxy surface. The self-assembly material is then annealed and etched to define the DSA pattern. The self-assembly material is deposited, annealed, and etched as described above using well known techniques.

Figure 2:
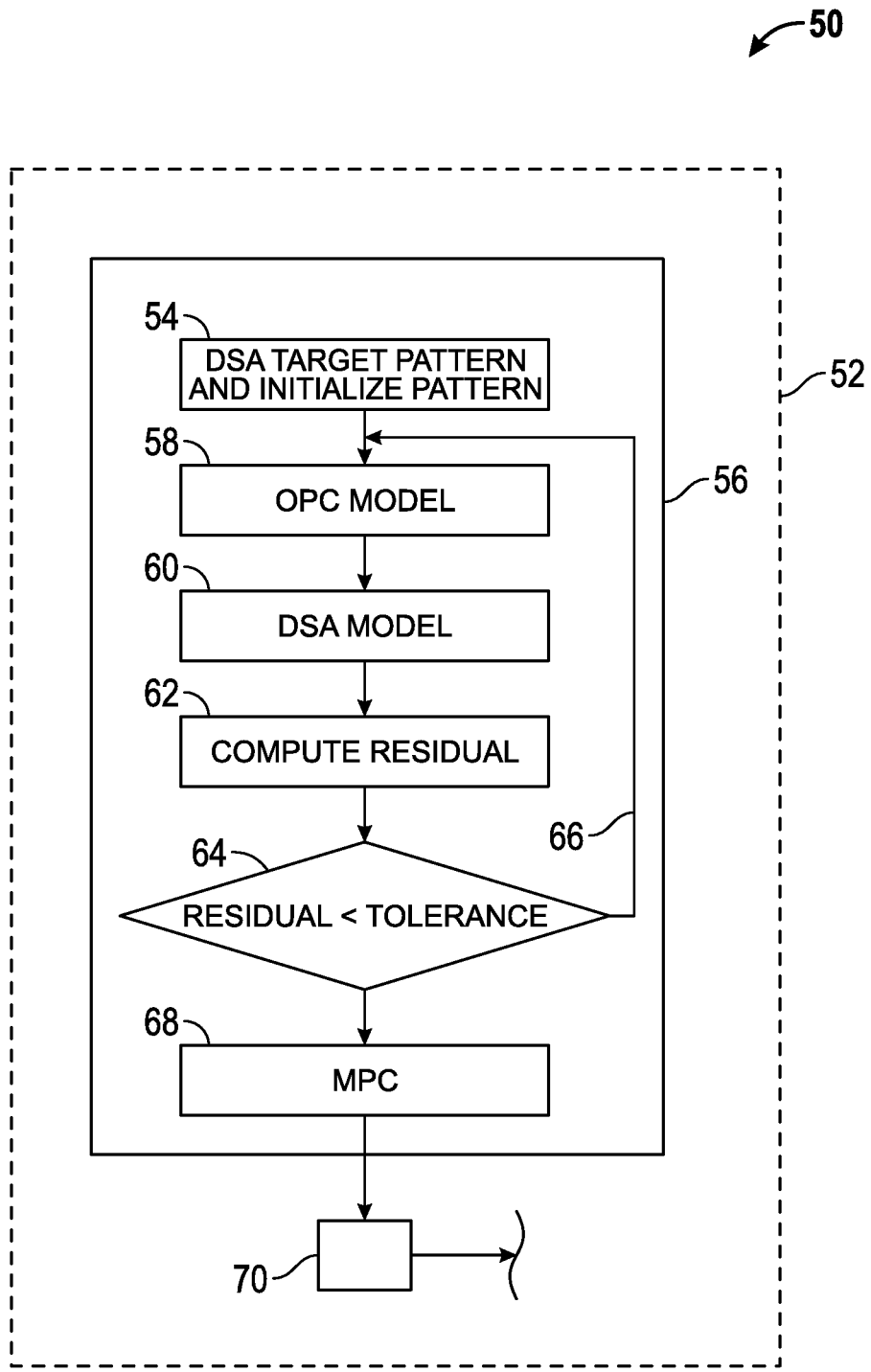
FIG. 2 is a schematic illustration of a block diagram of a method for fabricating an integrated circuit in accordance with another exemplary embodiment.

FIG. 2 is a schematic illustration of a block diagram of a method 50 for fabricating an integrated circuit (IC) in accordance with another exemplary embodiment. The method 50 includes generating a photomask (step 52) for forming a DSA directing pattern on a semiconductor substrate. As illustrated, a DSA target pattern and an initial pattern, e.g., initial OPCed pattern, are input into a computing system (step 54). The term "initial OPCed pattern" is used herein to denote an initial guess or approximation of a photomask pattern for lithographically defining the DSA directing pattern for forming the DSA target pattern. The DSA target pattern and the initial OPCed pattern are used in a coupled OPC and DSA PC, decoupled MPC flow 56 that includes the OPC model, the DSA model, and the MPC model as discussed above to account for a multitude of physical effects that occur during the DSA process.

In an exemplary embodiment, using the computing system, the OPC model is applied (step 58) to the initial OPCed pattern to produce an output DSA directing pattern. The DSA model is applied (step 60) to the output DSA directing pattern to produce an output DSA pattern.

In an exemplary embodiment, a DSA PC residual is computed (step 62) between the DSA target pattern and the output DSA pattern. The DSA PC residual is compared to a predetermined DSA PC tolerance (step 64). The application of the OPC and DSA models, computing of the DSA PC residual, and comparing the DSA PC residual to the predetermined DSA PC tolerance are cooperatively configured as an iterative loop 66. If the DSA PC residual is greater than the predetermined DSA PC tolerance, then the initial OPCed pattern is adjusted to generate an updated OPCed pattern that is fed back to the iterative loop 66 for one or more additional iterations. When the current iteration DSA PC residual is less than the predetermined DSA PC tolerance, then the corresponding current iteration, updated OPCed pattern is outputted from the iterative loop 66.

In an exemplary embodiment, a MPC algorithm is run using the computing system, the current iteration, updated OPCed pattern, and the MPC model (step 68) to produce an output MPCed pattern. The MPC algorithm is an algorithm that takes as an input the MPC target pattern (e.g., current iteration, updated OPCed pattern) that needs to be written on the photomask and provides as an output the output MPCed pattern, i.e., the pattern (or shots) for the mask writer to write on the photomask. The MPC algorithm takes into account various mask writing effects (e.g., long range and short range proximity effects) to ensure that when the mask writer writes the MPCed pattern, the actual pattern written on the photomask is close to or substantially matches the MPC target pattern. The MPC algorithm uses the MPC model that computes the pattern written on the photomask given the pattern (or shots) communicated to the mask writer. One example of a generic MPC algorithm is presented by the following MATLAB-like pseudocode:

```
function MPCed_patterns = MPC(MPC_model,MPC_target_patterns, MPC_parameters)
MPCed_patterns_current(1) = MPCed_patterns(MPC_Model, MPC_target_patterns);
for iteration =1:MPC_parameters.n_iterations
    mask_patterns = apply_MPC_model(MPCed_patterns_current(iteration), . . .
                    MPC_model);
    residual = compute_MPC_residual(mask_patterns, . . .
                    MPC_target_patterns);
    if(MPC_norm(residual) < MPC_parameters.tolerance)
        MPCed_patterns = MPCed_patterns_current(iteration);
        return
    else
        MPCed_patterns_current(iteration+1) = MPC_update(MPCed_patterns_current(iteration), . . .
                    MPC_target_patterns, . . .
                    residual, . . .
                    MPC_model, . . .
                    MPC_parameters);
    end
end
disp('MPC iterations did not coverage');
end
```

In this example, the MPC( ) function takes as inputs the MPC model, the MPC target patterns, and the parameters of the MPC algorithm and outputs the MPCed patterns. In the MPC( ) function, the MPCed patterns are generated iteratively. These patterns are initialized and the iterations are run within an iterative loop. On each pass of the iterative loop (for each iteration), the MPC model is first applied to the current MPCed patterns to compute the residual (the discrepancy between the MPC patterns corresponding to the given MPCed patterns and the MPC target patterns). Depending on the value of a certain cost function, and dependent on the residual, the current directing patterns are either output as the output of the MPC( ) function, if the norm of the residual is sufficiently small, or are updated for the next iteration to further reduce the cost function value corresponding to the residual.

One example of a generic coupled OPC and DSA PC, decoupled MPC flow 56 including the OPC model, the DSA model, and the MPC model is included in the following MATLAB-like pseudocode:

```
function MPCed_patterns = COUPLED_OPC_DSAPC_FLOW(DSA_target_patterns, . . .
                                                  DSA_model, OPC_model, MPC_model, . . .
                                                  COUPLED_OPC_DSAPC_FLOW_parameters)
OPCed_patterns_current(1) = initialize_OPCed_patterns(DSA_model, DSA_target_patterns, . . .
                                                      OPC_model);
for iteration =1:COUPLED_OPC_DSAPC_FLOW_parameters.n_iterations
    wafer_patterns = apply_OPC_model (OPCed_patterns_current(iteration), . . .
                                      OPC_model);
    DSA_patterns = apply_DSA_model (wafer_patterns, . . .
                                    DSA_model);
    residual = compute_DSAPC_residual (DSA_patterns, . . .
                                       DSA_target_patterns);
    if(DSAPC_norm(residual) < DSAPC_parameters.tolerance)
        MPCed_patterns = MPC(MPC_model,OPCed_patterns_current(iteration), MPC_parameters):
        return
    else
        OPCed_patterns_current(iteration+1) = COUPLED_OPC_DSAPC_FLOW_update( . . .
                                              OPCed_patterns_current(iteration), . . .
                                              DSA_target_patterns, . . .
                                              residual, . . .
                                              OPC_model, DSA_model, . . .
                                              COUPLED_OPC_DSAP_FLOW_parameters);
    end
end
disp('Coupled OPC and DSA PC flow iterations did not coverage');
end
```

In this example, the COUPLED_OPC_DSAPC_FLOW( ) function takes as inputs the DSA target patterns, the DSA model, the OPC model, the MPC model, and the parameters of the COUPLED_OPC_DSAPC_FLOW and outputs the OPCed patterns. In the COUPLED_OPC_DSAPC_FLOW( ) function, the OPCed patterns are generated iteratively. These patterns are initialized by inputting the initial OPCed patterns and the iterations are run within an iterative loop. On each pass of the iterative loop (for each iteration), the OPC model is applied to the current iteration OPCed patterns to produce the current iteration output wafer patterns, i.e., current iteration output DSA directing patterns; the DSA model is applied to the current iteration output wafer patterns to produce the current iteration output DSA patterns to compute the residual (the discrepancy between the current iteration output DSA pattern and the DSA target patterns). Depending on the value of a certain cost function, and dependent on the residual, the current iteration OPCed patterns are either output as the output of the iterative loop, if the norm of the residual is sufficiently small, or are updated for the next iteration to further reduce the cost function value corresponding to the residual. If the current iteration OPCed patterns are output from the iterative loop, the MPC (algorithm) is run using the current iteration OPCed patterns and the MPC model to produce as output the MPCed patterns.

The method 50 continues by communicating the current iteration, output MPCed pattern as the output mask writer pattern to a mask writer and writing on the photomask (step 70) to produce the patterned photomask. The patterned photomask is used to form the DSA directing pattern in the corresponding DSA pattern as previously discussed above in relation to FIG. 1.

Figure 3:
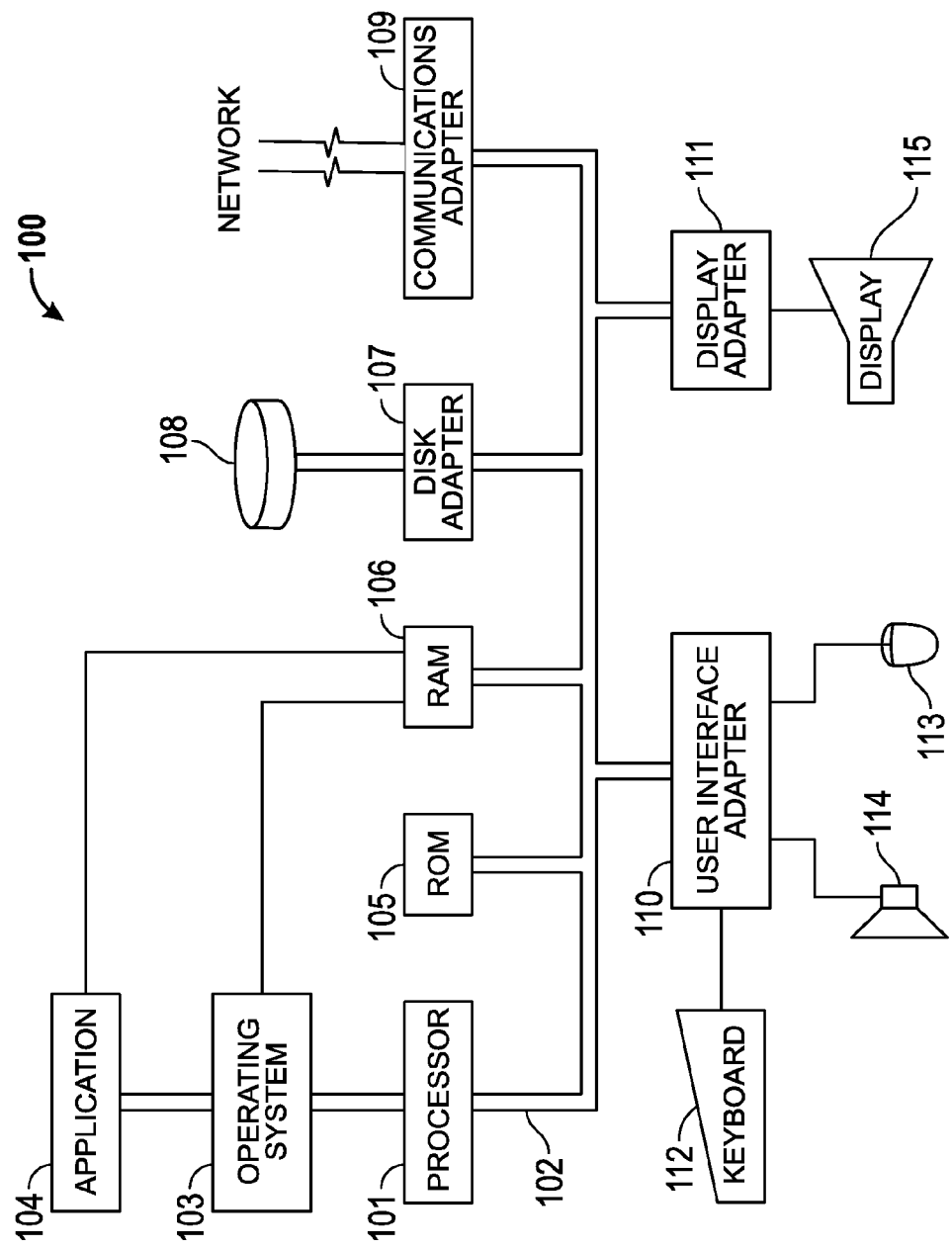
FIG. 3 is a schematic illustration of a block diagram of a computing system arranged in accordance with an exemplary embodiment.

FIG. 3 is a schematic illustration of a block diagram of a computing system 100 arranged in accordance with an exemplary embodiment. The various embodiments disclosed herein can be implemented on the computing system 100. The computing system 100 is also representative of a hardware environment for the present disclosure. For example, the computing system 100 may have a processor 101 coupled to various other components by a system bus 102.

An operating system 103 may run on the processor 101 and provide control and coordinate the functions of the various components of FIG. 3. An application 104 in accordance with the principles of examples of the present disclosure may execute in conjunction with the operating system 103 and provide calls and/or instructions to the operating system 103 where the calls/instructions implement the various functions or services to be performed by the application 104.

A read-only memory ("ROM") 105 may be coupled to a system bus 102 and can include a basic input/output system ("BIOS") that can control certain basic functions of the computing system 100. A random access memory ("RAM") 106 and a disk adapter 107 may also be coupled to system bus 102. It should be noted that software components, including the operating system 103 and the application 104, may be loaded into a RAM 106, which may be computing system's main memory for execution. The disk adapter 107 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 108, e.g., disk drive.

The computing system 100 may further include a communications adapter 109 coupled to the system bus 102. The communications adapter 109 may interconnect the system bus 102 with an external network (not shown) thereby facilitating the computing system 100 to communicate with other similar and/or different devices.

Input/Output ("I/O") devices may also be connected to the computing system 100 via a user interface adapter 110 and a display adapter 111. For example, a keyboard 112, a mouse 113, and a speaker 114 may be interconnected to the system bus 102 through the user interface adapter 110. Data may be provided to the computing system 100 through any of these example devices. A display monitor 115 may be connected to the system bus 102 by any display adapter 111. In this example manner, a user can provide data or other information to the computing system 100 through the keyboard 112 and/or the mouse 113, and obtain output from the computing system 100 via the display 115 and/or the speaker 114.

Accordingly, methods for fabricating integrated circuits including generating photomasks for DSA have been described. In an exemplary embodiment, a photomask is generated for forming a DSA directing pattern on a semiconductor substrate. The DSA directing pattern is for guiding a self-assembly material deposited thereon that undergoes DSA to form a DSA pattern. Generating the photomask includes, using a computing system, inputting a DSA target pattern and an initial pattern. An output mask writer pattern is produced from the initial pattern using the computing system, the DSA target pattern, a DSA model, an OPC model, and a MPC model. The output mask writer pattern is for a mask writer to write on the photomask.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
using a computing system, inputting a DSA target pattern and an initial pattern; and
using the computing system, the DSA target pattern, a DSA model, an OPC model, and a MPC model, producing an output mask writer pattern from the initial pattern, wherein the output mask writer pattern is for a mask writer to write on the photomask, wherein the initial pattern is an initial mask pattern and the MPC, OPC, and DSA models cooperate to form part of an iterative loop, and wherein using the computing system, the DSA target pattern, and the DSA, OPC, and MPC models comprises:
providing the initial mask pattern to the iterative loop to iteratively apply the MPC, OPC, and DSA models to produce a current iteration, updated mask pattern and correspondingly a current iteration, output DSA pattern;
using the computing system, computing a DSA PC residual between the DSA target pattern and the current iteration, output DSA pattern; and
using the computing system, comparing the DSA PC residual to a predetermined DSA PC tolerance and if the DSA PC residual is less than the redetermined DSA PC tolerance, then outputting the current iteration, updated mask pattern from the iterative loop as the output mask writer pattern.

2. The method of claim 1, wherein inputting the DSA target pattern comprises inputting a line and space pattern, an isolated line pattern, a contact hole pattern, and/or other polygon pattern.

3. The method of claim 1, wherein generating the photomask comprises generating an optical lithography photomask.

4. The method of claim 1, wherein generating the photomask comprises generating an EUV lithography photomask.

5. The method of claim 4, further comprising:
patterning a photoresist layer overlying the semiconductor substrate using the photomask.

6. The method of claim 5, wherein patterning the photoresist layer comprises patterning the photoresist layer to form the DSA directing pattern having a graphoepitaxy surface that defines a pre-pattern opening.

7. The method of claim 6, further comprising depositing the self-assembly material on the graphoepitaxy surface including into the pre-pattern opening.

8. The method of claim 7, further comprising phase separating the self-assembly material to define the DSA pattern.

9. The method of claim 8, further comprising etching the DSA pattern to form a mask for transferring the DSA pattern to the semiconductor substrate.

10. The method of claim 5, wherein patterning the photoresist layer comprises patterning the photoresist layer to form a patterned photoresist layer, and wherein the method further comprises:
using the patterned photoresist layer to form the DSA directing pattern having a chemical epitaxy surface.

11. The method of claim 10, further comprising depositing the self-assembly material on the chemical epitaxy surface.

12. The method of claim 11, further comprising phase separating the self-assembly material to define the DSA pattern.

13. The method of claim 12, further comprising etching the DSA pattern to form a mask for transferring the DSA pattern to the semiconductor substrate.

14. A method for fabricating an integrated circuit comprising:
generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
using a computing system, inputting a DSA target pattern and an initial mask pattern;
using the computing system, applying a MPC model to the initial mask pattern to produce a first output mask pattern;
using the computing system, applying an OPC model to the first output mask pattern to produce a first output DSA directing pattern;
using the computing system, applying a DSA model to the first output DSA directing pattern to produce a first output DSA pattern;
using the computing system, computing a DSA PC residual between the DSA target pattern and the first output DSA pattern; and
using the computing system, comparing the DSA PC residual to a predetermined DSA PC tolerance and if the DSA PC residual is greater than the predetermined DSA PC tolerance, then adjusting the initial mask pattern to generate a first updated mask pattern.

15. The method of claim 14, wherein applying the MPC, OPC, and DSA models, computing the DSA PC residual, and comparing the DSA PC residual cooperate to define an iterative loop, and wherein the method further comprises:
  using the computing system, inputting the first updated mask pattern to the iterative loop to iteratively apply the MPC, OPC, and DSA models to produce a current iteration, updated mask pattern and correspondingly a current iteration DSA PC residual that is less than the predetermined DSA PC tolerance; and
  using the computing system, outputting the current iteration, updated mask pattern from the iterative loop, wherein the current iteration, updated mask pattern is for a mask writer to write on the photomask.

16. A method for fabricating an integrated circuit comprising:
  generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
    using a computing system, inputting a DSA target pattern and an initial OPCed pattern;
    using the computing system, applying an OPC model to the initial OPCed pattern to produce a first output DSA directing pattern;
    using the computing system, applying a DSA model to the first output DSA directing pattern to produce a first output DSA pattern;
    using the computing system, computing a DSA PC residual between the DSA target pattern and the first output DSA pattern; and
    using the computing system, comparing the DSA PC residual to a predetermined DSA PC tolerance and if the DSA PC residual is greater than the predetermined DSA PC tolerance, then adjusting the initial OPCed pattern to generate a first updated OPCed pattern.

17. The method of claim 16, wherein applying the OPC and DSA models, computing the DSA PC residual, and comparing the DSA PC residual cooperate to define an iterative loop, and wherein the method further comprises:
  using the computing system, inputting the first updated OPCed pattern to the iterative loop to iteratively apply the OPC and DSA models to produce a current iteration, updated OPCed pattern and correspondingly a current iteration DSA PC residual that is less than the predetermined DSA PC tolerance;
  using the computing system, outputting the current iteration, updated OPCed pattern from the iterative loop; and
  using the computing system, the current iteration, updated OPCed pattern, and a MPC model, running a MPC algorithm to produce an output MPCed pattern for a mask writer to write on the photomask.

18. A method for fabricating an integrated circuit comprising:
  generating a photomask for forming a DSA directing pattern overlying a semiconductor substrate, wherein the DSA directing pattern is configured to guide a self-assembly material deposited thereon that undergoes directed self-assembly (DSA) to form a DSA pattern, and wherein generating the photomask comprises:
    using a computing system, inputting a DSA target pattern and an initial pattern; and
    using the computing system, the DSA target pattern, a DSA model, an OPC model, and a MPC model, producing an output mask writer pattern from the initial pattern, wherein the output mask writer pattern is for a mask writer to write on the photomask, wherein the initial pattern is an initial OPCed pattern and the OPC and DSA models cooperate to form part of an iterative loop, and wherein using the computing system, the DSA target pattern, and the DSA, OPC, and MPC models comprises:
      providing the initial OPCed pattern to the iterative loop to iteratively apply the OPC and DSA models to produce a current iteration, updated OPCed pattern and correspondingly a current iteration, output DSA pattern;
      using the computing system, computing a DSA PC residual between the DSA target pattern and the current iteration, output DSA pattern; and
      using the computing system, comparing the DSA PC residual to a predetermined DSA PC tolerance and if the DSA PC residual is less than the predetermined DSA PC tolerance, then outputting the current iteration, updated OPCed pattern from the iterative loop.

19. The method of claim 18, wherein using the computing system, the DSA target pattern, and the DSA, OPC, and MPC models further comprises;
  using the computing system, the current iteration, updated OPCed pattern, and the MPC model, running a MPC algorithm to produce an output MPCed pattern as the output mask writer pattern.

* * * * *